United States Patent [19]
Stockstad et al.

[11] Patent Number: 5,285,170
[45] Date of Patent: Feb. 8, 1994

[54] OPERATIONAL AMPLIFIER WITH ALL NPN TRANSISTOR OUTPUT STAGE

[75] Inventors: Troy L. Stockstad, Phoenix; Robert L. Vyne; Thomas D. Petty, both of Tempe, all of Ariz.

[73] Assignee: Motorola, Inc., Schaumburg, Ill.

[21] Appl. No.: 983,357

[22] Filed: Nov. 30, 1992

[51] Int. Cl.$^5$ ............................................... H03F 3/45
[52] U.S. Cl. .................................... 330/255; 330/275; 330/273; 330/263
[58] Field of Search ................ 330/255, 273, 263, 275

[56] References Cited
U.S. PATENT DOCUMENTS 4,871,977  10/1989  Schilling et al. .................... 330/255
5,166,636  11/1992  Bien .................................... 330/255

Primary Examiner—Robert J. Pascal
Assistant Examiner—J. Dudek
Attorney, Agent, or Firm—Robert D. Atkins

[57] ABSTRACT

An operational amplifier achieves higher operating speed by using an all NPN transistor output drive stage. A control circuit in output drive stage receives an input signal and providing first and second control signals. The first and second control signals in turn drive first and second NPN output drive transistors arranged in a totem pole configuration between first and second power supply conductors.

14 Claims, 1 Drawing Sheet

OPERATIONAL AMPLIFIER WITH ALL NPN TRANSISTOR OUTPUT STAGE

BACKGROUND OF THE INVENTION

The present invention relates to operational amplifiers, and more particularly, to an operational amplifier having an all NPN transistor output stage.

Operational amplifiers (op amps) are well known in electronic circuit design. A conventional op amp receives first and second input signals at its inverting and non-inverting inputs and provides an output signal as an amplified difference of the first and second input signals. The first and second input signals are typically processed through one or more differential amplifier stages and then through a differential-to-single-ended converter. An output drive stage takes the single-ended output signal and enables upper and lower output drive transistors serially coupled between first and second power supply potentials. The upper drive transistor in the output drive stage is typically NPN and the bottom drive transistor is PNP.

A significant problem experienced by op amps with the aforedescribed PNP-NPN transistor output stage is a limited operating frequency, say 1 MHz. The problem is principally due to the slow frequency response of the PNP transistor in the output drive stage. NPN transistors are known to operate at a much higher frequency. As the need for higher speed op amps continues to grow, it becomes advantageous to eliminate any PNP transistors from the output drive stage to allow the op amp to operate at higher frequencies.

SUMMARY OF THE INVENTION

Briefly stated, the invention comprises an output stage of an operational amplifier including a control circuit responsive to an input signal for providing first and second control signals. A first transistor includes a base receiving the first control signal, a collector coupled to a first power supply conductor, and an emitter coupled to an output of the output stage. A second transistor includes a base receiving the second control signal, an emitter coupled to a second power supply conductor, and a collector coupled to the output of the output stage.

BRIEF DESCRIPTION OF THE DRAWING

The sole FIGURE is a simplified operational amplifier with an all NPN transistor output stage.

DETAILED DESCRIPTION OF THE PREFERRED EMBODIMENT

Figure 1:
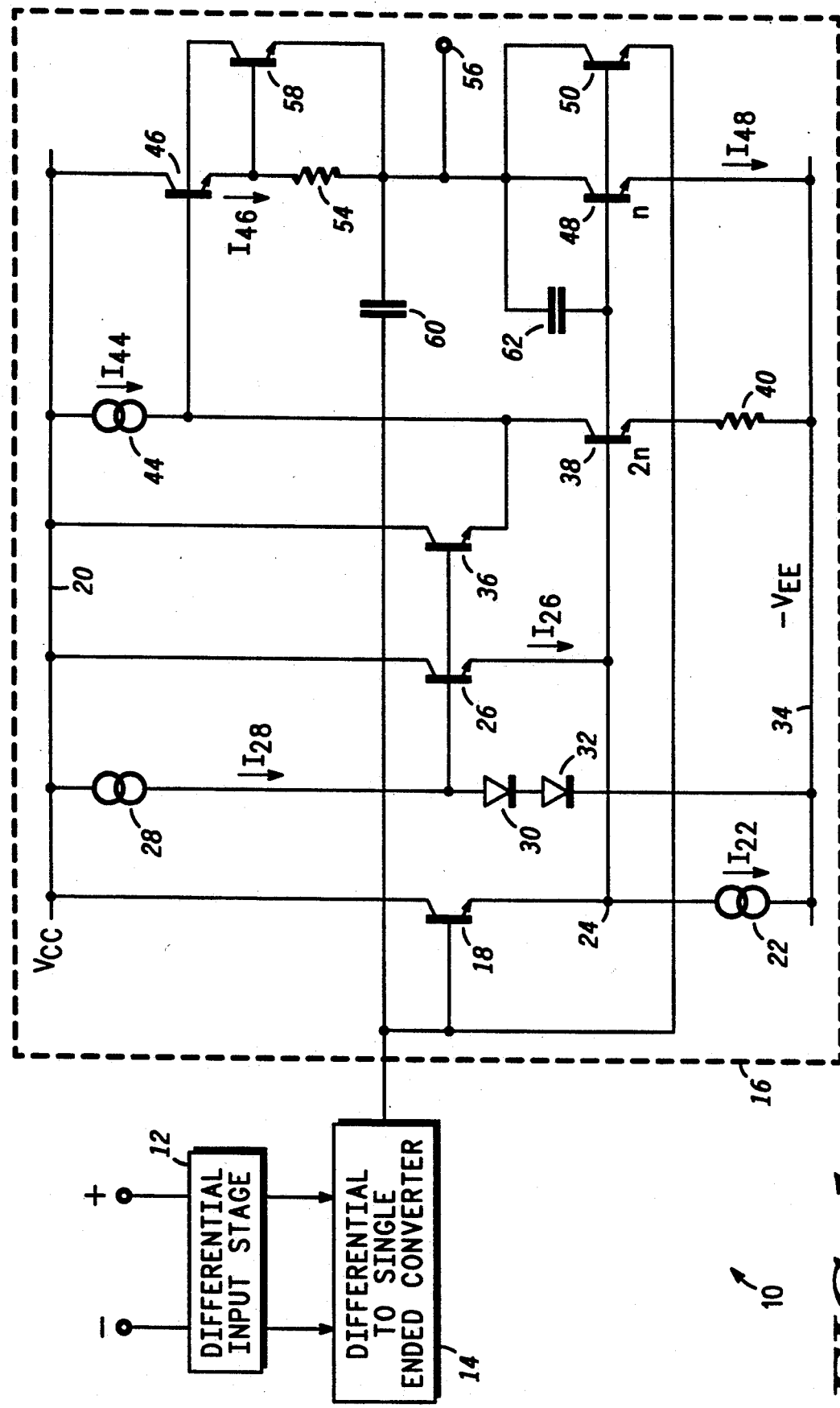

An op amp 10 is shown in the sole FIGURE suitable for manufacturing as an integrated circuit using conventional integrated circuit processes. Op amp 10 receives first and second input signals at its inverting and non-inverting inputs. The first and second input signals are processed through a differential input stage 12 typically comprising one or more differential transistor pairs (not shown). The output of the last differential transistor pair is coupled to differential-to-single-ended converter 14 for providing a single-ended signal to output drive stage 16.

As part of the present invention, output drive stage 16 uses all NPN transistors for increased operating speed. The single-ended signal from converter 14 is applied at the base of transistor 18. The collector of transistor 18 is coupled to power supply conductor 20 operating at a positive potential $V_{CC}$, say $+15$ VDC. The emitter of transistor 18 is coupled to the output of current supply 22 at node 24. Transistor 26 includes a collector coupled to power supply conductor 20, an emitter coupled to node 24, and a base coupled to the output of current supply 28. The base of transistor 26 is also coupled through diodes 30 and 32 to power supply conductor 34 operating at a negative potential $-V_{EE}$, say $-15$ VDC. Transistor 36 includes a collector coupled to power supply conductor 20, a base coupled to the output of current supply 28, and an emitter coupled to the collector of transistor 38. The emitter of transistor 38 is coupled through resistor 40 to power supply conductor 34, while its collector is coupled to the output of current supply 44 at the base of transistor 46. The base of transistor 38 is coupled to the bases of transistors 48 and 50 at node 24.

Continuing with the upper output drive, transistor 46 includes a collector coupled to power supply conductor 20 and an emitter coupled through resistor 54 to output 56 of output stage 16. Transistor 46 is the upper output drive transistor. The base of transistor 46 is also coupled to the collector of transistor 58 which includes a base coupled to the emitter of transistor 46 and an emitter coupled to output 56. Capacitor 60 is coupled between output 56 and the base of transistor 18 for compensation.

For the lower output drive, the collectors of transistors 48 and 50 are coupled to output 56, while the emitter of transistor 48 is coupled to power supply conductor 34 and the emitter of transistor 50 is coupled to the base of transistor 18. Capacitor 62 is coupled between the collector and base of transistor 48 for compensation. Transistor 48 has an emitter area "m" times the reference emitter area of transistor 26 and diodes 30 and 32, where "n" may be equal to six. Transistor 38 has an emitter area "2n" times the same reference emitter area.

The operation of output drive stage 16 proceeds as follows. Current supply 28 sinks a predetermined current of say 20 μa through diodes 30 and 32 and establishes a fixed voltage at the base of transistors 26 and 36. By writing voltage equation around diodes 30 and 32 and transistors 26 and 48, it can be shown that:

$$I_{28}^2 = I_{26} * I_{48}/n \quad (1)$$

where
$I_{28}$ is the current from current supply 28
$I_{26}$ is the current flowing through transistor 26
$I_{48}$ is the current flowing through transistor 48
n is the emitter area ratio of transistor 48 to the reference emitter area A current $I_{44}$ from current supply 44 of say 400 μa substantially flows through transistor 38 and resistor 40.

The base voltage necessary for transistor 38 to conduct 400 μa also drives transistor 48 and establishes its quiescent ("Q") current $I_{48}$. The relationship between the current flowing through transistor 38 and current $I_{48}$ is represented as:

$$I_{48} = 0.5 * I_{38} * e^{\frac{q \, I_{38} R_{40}}{kT}} \quad (2)$$

where:
$R_{40}$ is the value of resistor 40
q is electron charge
k is Boltzmann constant T is absolute temperature Thus, current $I_{26}$ may be determined from equation (1) at the "Q" of output drive stage 16. The currents $I_{28}$, $I_{26}$, and $I_{48}$ are thus well defined to maintain good DC stability.

Now consider an increasing signal from differential-to-singled-ended converter 14. Transistor 18 conducts more current and increases the voltage at node 24. Accordingly, transistor 48 turns on harder and conducts more current $I_{48}$. Current $I_{26}$ must decrease as per equation (1). Transistor 38 also conducts more current and decreases the base voltage of transistor 46. With transistor 46 conducting less current and transistor 48 conducting more current, the voltage at output 56 decreases.

As the voltage at node 24 continues to increase with the increasing signal from differential-to-singled-ended converter 14, transistor 38 conducts a ratio (less than unity) of current $I_{48}$ because of degenerative resistor 40 and the difference in emitter areas. When current supply 44 can no longer source transistor 38, it starts to saturate and lowers its collector voltage. Transistor 36 turns on to supply additional collector current for transistor 38 and keep it out of saturation. If the voltage at node 24 becomes too high and transistor 48 starts to saturate, transistor 50 turns on in inverse-active mode and sources current away from the base of transistor 18, thereby limiting the base drive for transistor 48. The maximum negative voltage at output 56 is output is $V_{EE}+V_{SAT48}$, where $V_{SAT48}$ is the saturation potential of transistor 48.

When the output signal from differential-to-single-ended converter 14 decreases, transistor 18 conducts less current and the voltage at node 24 falls. Transistor 26 sources current $I_{26}$ into current supply 22 to maintain its constant 80 μa current flow. Transistor 36 conducts substantially no current at this time. Transistors 38 and 48 each conduct less current with less voltage at node 24. With less current flowing through transistor 38, current supply 44 provides more base current into transistor 46, causing more current $I_{46}$ to flow through transistor 46. The voltage at output 56 increases.

If the sourcing current from the emitter of transistor 46 becomes to high, resistor 54 biases transistor 58 into conduction. The collector of transistor 58 then sinks current away from the base of transistor 46 to provide a current limit. The maximum positive voltage at output 56 is $V_{CC}-V_{SAT44}-V_{be46}-I_{46}*R_{54}$, where $V_{SAT44}$ is the saturation potential of the transistor in current supply 44, $V_{be46}$ is the base-emitter junction potential of transistor 46, and $R_{54}$ is the value of resistor 54.

Thus, a key feature of the present invention is the all NPN transistor output stage for op amp 10. The use of an NPN transistor for the upper and lower output drive allows op amp 10 to approach operating speed in the range of 100 MHz, depending on the speed of the NPN transistors.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An output stage of an operational amplifier, comprising:

a control circuit responsive to an input signal for providing first and second control signals;

a first transistor having a base, an emitter and a collector, said base receiving said first control signal, said collector being coupled to a first power supply conductor, said emitter being coupled to an output of the output stage; and a second transistor having a base, an emitter and a collector, said base receiving said second control signal, said emitter being coupled to a second power supply conductor, said collector being coupled to said output of the output stage;

said control circuit including, a third transistor having a base, an emitter and a collector, said base receiving said input signal, said collector being coupled to said first power supply conductor, said emitter being coupled to said base of said second transistor at a first node for providing said second control signal, first current supply means having an output coupled to said first node for sinking a predetermined current;

a fourth transistor having a base, an emitter and a collector, said base being coupled to said first node, said collector being coupled to said base of said first transistor for providing said first control signal, a first resistor coupled between said emitter of said fourth transistor and said second power supply conductor, and second current supply means having an output coupled to said collector of said fourth transistor for sinking a predetermined current.

2. The output stage of claim 1 wherein said control circuit further includes:

a fifth transistor having a base, an emitter and a collector, said emitter being coupled to said first node;

third current supply means having an output for providing a predetermined current;

a first diode having an anode and a cathode, said anode being coupled to said output of said third current supply means and to said base of said fifth transistor; and a second diode having an anode coupled to said cathode of said first diode and having a cathode coupled to said second power supply conductor.

3. The output stage of claim 2 wherein said control circuit further includes a sixth transistor having a base, an emitter and a collector, said base being coupled to said base of said fifth transistor, said collector being coupled to said first power supply conductor, said emitter being coupled to said collector of said fourth transistor.

4. The output stage of claim 3 further including:

a second resistor coupled between said emitter of said first transistor and said output of the output stage;

a first capacitor coupled between said output of the output stage and said base of said third transistor; and a second capacitor coupled between said collector of said second transistor and said base of said second transistor.

5. The output stage of claim 4 further including:

a seventh transistor having a base, an emitter and a collector, said collector being coupled to said base of said first transistor, said base being coupled to said emitter of said first transistor, said emitter being coupled to said output of the output stage; and an eighth transistor having a base, an emitter and a collector, said collector being coupled to said output of the output stage, said base being coupled to said first node, said emitter being coupled to said base of said third transistor.

6. An operational amplifier, comprising:

a differential input stage having first and second inputs coupled for receiving first and second input signals and providing a differential output signal;

a differential-to-single-ended converter having an input for receiving said differential output signal and having an output for providing a single-ended signal;

a control circuit responsive to said single-ended signal for providing first and second control signals;

a first NPN transistor having a base, an emitter and a collector, said base receiving said first control signal, said collector being coupled to a first power supply conductor, said emitter being coupled to an output of the operational amplifier; and a second NPN transistor having a base, an emitter and a collector, said base receiving said second control signal, said emitter being coupled to a second power supply conductor, said collector being coupled to said output of the operational amplifier;

said control circuit including, a third NPN transistor having a base, an emitter and a collector, said base receiving said single-ended signal, said collector being coupled to said first power supply conductor, said emitter being coupled to said base of said second NPN transistor at a first node for providing said second control signal, first current supply means having an output coupled to said first node for sinking a predetermined current, a fourth NPN transistor having a base, an emitter and a collector, said base being coupled to said first node, said collector being coupled to said base of said first NPN transistor for providing said first control signal, a first resistor coupled between said emitter of said fourth NPN transistor and said second power supply conductor, second current supply means having an output coupled to said collector of said fourth NPN transistor for sinking a predetermined current, a fifth NPN transistor having a base, an emitter and a collector, said emitter being coupled to said first node, third current supply means having an output for providing a predetermined current, a first diode having an anode and a cathode, said anode being coupled to said output of said third current supply means and to said base of said fifth NPN transistor, a second diode having an anode coupled to said cathode of said first diode and having a cathode, and a third diode having an anode coupled to said cathode of said second diode and having a cathode coupled to said second power supply conductor.

7. The operational amplifier of claim 6 wherein said control circuit further includes a sixth NPN transistor having a base, an emitter and a collector, said base being coupled to said base of said fifth NPN transistor, said collector being coupled to said first power supply conductor, said emitter being coupled to said collector of said fourth NPN transistor.

8. The operational amplifier of claim 7 further including:

a second resistor coupled between said emitter of said first NPN transistor and said output of the operational amplifier;

a first capacitor coupled between said output of the operational amplifier and said base of said third NPN transistor; and a second capacitor coupled between said collector of said second NPN transistor and said base of said second NPN transistor.

9. The operational amplifier of claim 8 further including:

a seventh NPN transistor having a base, an emitter and a collector, said collector being coupled to said base of said first NPN transistor, said base being coupled to said emitter of said first NPN transistor, said emitter being coupled to said output of the operational amplifier; and an eighth NPN transistor having a base, an emitter and a collector, said collector being coupled to said output of the operational amplifier, said base being coupled to said first node, said emitter being coupled to said base of said third NPN transistor.

10. An output stage of an operational amplifier, comprising:

a first NPN transistor having a base, an emitter and a collector, said collector being coupled to a first power supply conductor, said emitter being coupled to an output of the output stage;

a second NPN transistor having a base, an emitter and a collector, said emitter being coupled to a second power supply conductor, said collector being coupled to said output of the output stage;

a third NPN transistor having a base, an emitter and a collector, said base receiving an input signal, said collector being coupled to said first power supply conductor, said emitter being coupled to said base of said second NPN transistor at a first node;

first current supply means having an output coupled to said first node for sinking a predetermined current;

a fourth NPN transistor having a base, an emitter and a collector, said base being coupled to said first node, said collector being coupled to said base of said first NPN transistor, said emitter being coupled to said second power supply conductor;

second current supply means having an output coupled to said collector of said fourth NPN transistor for sinking a predetermined current;

a fifth NPN transistor having a base, an emitter and a collector, said emitter being coupled to said first node;

third current supply means having an output for providing a predetermined current;

a first diode having an anode and a cathode, said anode being coupled to said output of said third current supply means and to said base of said fifth NPN transistor; and a second diode having an anode coupled to said cathode of said first diode and having a cathode coupled to said second power supply conductor.

11. The output stage of claim 10 further including a sixth NPN transistor having a base, an emitter and a collector, said base being coupled to said base of said fifth NPN transistor, said collector being coupled to said first power supply conductor, said emitter being coupled to said collector of said fourth NPN transistor.

12. The output stage of claim 11 further including a first resistor coupled between said emitter of said fourth NPN transistor and said second power supply conductor.

13. The output stage of claim 12 further including:
a second resistor coupled between said emitter of said first NPN transistor and said output of the output stage;
a first capacitor coupled between said output of the output stage and said base of said third NPN transistor; and
a second capacitor coupled between said collector of said second NPN transistor and said base of said second NPN transistor.

14. The output stage of claim 13 further including:
a seventh NPN transistor having a base, an emitter and a collector, said collector being coupled to said base of said first NPN transistor, said base being coupled to said emitter of said first NPN transistor, said emitter being coupled to said output of the output stage; and
an eighth NPN transistor having a base, an emitter and a collector, said collector being coupled to said output of the output stage, said base being coupled to said first node, said emitter being coupled to said base of said third NPN transistor.

* * * * *